United States Patent [19]
Nakasuji

[11] Patent Number: 6,078,054
[45] Date of Patent: Jun. 20, 2000

[54] CHARGED PARTICLE BEAM OPTICAL SYSTEM

[75] Inventor: Mamoru Nakasuji, Kawasaki, Japan

[73] Assignee: Nikon Corporation, Tokyo, Japan

[21] Appl. No.: 09/143,168

[22] Filed: Aug. 28, 1998

[30] Foreign Application Priority Data

Aug. 28, 1997 [JP] Japan .................................. 9-245918

[51] Int. Cl.⁷ .................................................. H01J 37/317
[52] U.S. Cl. .................................. 250/396 R; 250/492.22
[58] Field of Search ........................ 250/396 R, 396 ML, 250/492.23, 492.22, 398

[56] References Cited

U.S. PATENT DOCUMENTS 5,973,333  10/1999  Nakasuji et al. .................... 250/492.23

OTHER PUBLICATIONS

Hosokawa, "Practical Feasibility of the Multistage Deflection Theory," *J. Vac. Sci. Technol.* 13:1050–1054 (1995).

*Primary Examiner*—Kiet T. Nguyen
*Attorney, Agent, or Firm*—Klarquist Sparkman Campbell Leigh & Whinston, LLP

[57] ABSTRACT

Charged-particle-beam (CPB) optical systems are provided that reduce the required number of power supplies used to energize the constituent lenses and deflectors, while imparting no adverse effects on stability and settling time of the power supplies. Such CPB optical systems project and form an image of an irradiated portion of a mask, wherein the image passes through a mask that receives the charged-particle-beam illumination and is projected onto a wafer by a two-stage lens and multiple deflectors. At least most of the deflectors used for aberration reduction comprise, respectively, a main coil having a large ampere-turn and an auxiliary coil having a small ampere-turn. The main coils of the such deflectors are driven by the same power supply.

7 Claims, 1 Drawing Sheet

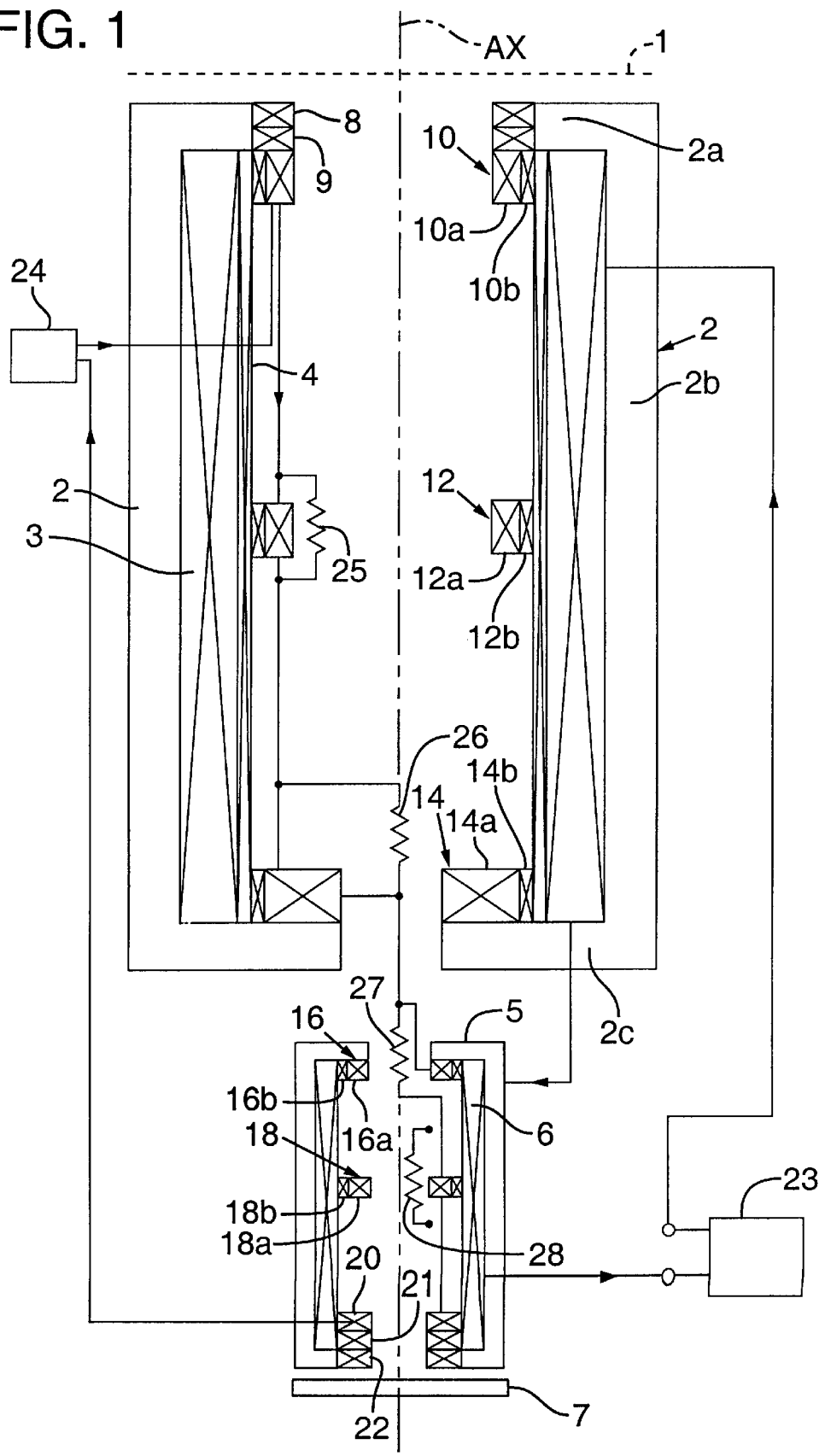

CHARGED PARTICLE BEAM OPTICAL SYSTEM

FIELD OF THE INVENTION

The present invention is related to charged-particle-beam (CPB) optical systems that use a charged particle beam to transfer a pattern defined on a mask onto a substrate (such as a wafer). More specifically, the invention is directed to, inter alia, CPB optical systems exhibiting improved precision, throughput, and stability; requiring a reduced number of driving power sources for the constituent lenses and deflectors; and exhibiting a faster settling time of the driving power sources for the lenses and deflectors.

BACKGROUND OF THE INVENTION

Conventional technology will be described with respect to electron-beam reduction-transfer technology.

Electron-beam reduction-transfer apparatus are representative microlithography devices that project a pattern, such as of an integrated circuit, onto a suitable substrate such as a semiconductor wafer. The pattern is defined by a mask that is irradiated by an electron beam. Electrons passing through the mask are capable of forming an image of the irradiated portion of the pattern. The image is projected using a two-stage projection lens (projection-optical system) onto the substrate. In this regard, reference is made to, e.g., Japan Kokai patent document no. Hei 5-160012. In such an apparatus, the electron beam normally cannot collectively irradiate the entire mask region at one time. Consequently, the field of view of the projection-optical system is typically smaller than the mask pattern, and the mask pattern is typically divided (segmented) into multiple small regions (mask subfields) that are individually projected onto the substrate. In this regard, reference is made to U.S. Pat. Nos. 5,260,151 and 5,466,904.

Several configurations of the projection-optical system are known, e.g., MOL (Moving Objective Lens) and VAL (Variable Axis Lens) configurations. Both configurations involve movement (e.g., lateral shifting) of the optical axis of the projection lens by application of a lateral magnetic field (using an appropriate deflector) to the magnetic field generated by the projection lens. The projection lens is typically in a symmetrical magnetic doublet (SMD) configuration that is effective in substantially reducing certain aberrations.

An SMD lens system is a "two-stage" design comprising two separate lenses each having a respective pole piece bore diameter and lens gap. The lenses are coaxial and arranged in tandem on the optical axis. In terms of overall configuration, each lens is the mirror image of the other about a location on the optical axis between the lenses. Normally, the downstream, or second, lens (situated closer to the substrate) is dimensionally reduced in size, compared to the upstream, or first, lens (situated closer to the mask), by the demagnification ratio of the lens system. Also, the magnetic field generated by the first lens has an opposite polarity to the magnetic field generated by the second lens. Each lens has a respective main electrical coil. The ampere-turn values of each main coil are normally equal. *J. Vac. Sci. Techol.* 12(6) November/December, 1975). The SMD configuration is effective in canceling θ-direction aberrations and distortions and reducing chromatic aberrations of magnification and rotation essentially to nil.

In order to ensure adequate positional accuracy of the transferred image using a conventional apparatus as described above, conventional wisdom dictates that a separate power supply having an output precision of at least $10^{-6}$ be used to energize each coil of each lens and deflector of the electron-beam optical system (including irradiation-optical system and projection-optical system). Thus, individual high-precision power supplies are conventionally connected to each lens of the two-stage lens system in order to achieve adequate control of image rotation and magnification.

In the face of contemporary demands for ever higher throughput and precision, the field-of-view dimensions of the electron-beam optical system on the mask is about 10 mm, and positional stability of the electron beam is 5 nm or less. To achieve such specifications, the stability of each power supply must be $5 \times 10^{-7}$ or less.

Changing the beam-deflection angle as effected by a deflector involves a change in the electrical current applied to the respective deflector. Such an operation is required each time, for example, a different mask subfield is being illuminated. Each such change requires sufficient settling time of the power supply used to energize the deflector. During such a settling period, no actual projection transfer can be performed.

When performing pattern transfer of a segmented mask as summarized above, the mask subfields are selected and exposed at a high speed (preferably 25 μsec or less per subfield). To achieve such performance, many separate and highly stable power supplies are utilized that can be controlled at high speeds (one power supply per deflector). This results in high cost.

SUMMARY OF THE INVENTION

In view of the foregoing, an object of the present invention is to provide a charged-particle-beam (CPB) optical system (for transferring a mask pattern onto a suitable substrate) exhibiting high transfer precision, high throughput, and a reduction in the number of power supplies required to energize the CPB optical system, without any decrease in stability or increase in settling time for lenses and deflectors.

According to a first aspect of the invention, CPB optical systems are provided. A first representative embodiment of such a system comprises a projection-lens system that receives a charged particle beam that has passed through an illuminated region of a pattern defined by a mask so as to form an image of the illuminated region. The projection-lens system comprises a two-stage lens system and is operable to project the image onto a surface of a substrate. The first representative embodiment also comprises multiple charged-particle-beam deflectors associated with the two-stage lens system. Each deflector comprises a main coil, wherein at least one of the deflectors additionally comprises an auxiliary coil. The main and auxiliary coils of the deflector have a relatively large and a relatively small ampere-turn value, respectively. At least two of the main coils of the multiple deflectors are driven by a single power supply.

A second representative embodiment comprises a projection-lens system similar to that in the first representative embodiment. The second representative embodiment also comprises multiple CPB deflectors associated with the two-stage lens system, wherein each deflector comprises a main coil. The second representative embodiment also comprises an adjusting resistor, wherein the coils of at least two of the deflectors are connected in series to a single power source and the adjusting resistor is connected in parallel to at least one of the coils.

A third representative embodiment comprises a projection-lens system similar to that in the first representative embodiment. The constituent two-stage lens system comprises a first lens and a second lens each comprising a respective main coil. At least one of the first and second lenses additionally comprises an auxiliary coil, wherein the main and auxiliary coils of the lens have relatively large ampere-turn and small ampere-turn values, respectively. A single power supply is connected to the main coil of one of the first and second lenses and to the auxiliary coil of the other of the first and second lenses.

A fourth representative embodiment comprises a projection-lens system similar to that in the first representative embodiment. The constituent two-stage lens system comprises a first lens and a second lens each comprising a main coil. An adjusting resistor is connected in parallel to the main coil of at least one of the first and second lenses. A single power supply is connected to the main coils of the first and second lenses.

A fifth representative embodiment comprises a projection-lens system similar to that in the first representative embodiment. Multiple deflectors are situated and configured to reduce, when energized, aberrations of the charged-particle-beam optical system. At least most of the deflectors each comprise a respective main coil and a respective auxiliary coil. The respective main coils and corresponding auxiliary coils have a relatively large ampere-turn value and a relatively small ampere-turn value, respectively. A single power supply is connected to at least most of the main coils of the deflectors. This embodiment allows precision adjustments of the current ratios of the lens system and/or the deflection sensitivity ratio of the deflectors.

A sixth representative embodiment comprises a projection-lens system similar to that in the first representative embodiment. Multiple deflectors are situated and configured to reduce, when energized, aberrations of the charged-particle-beam optical system. Each deflector comprises a respective main coil. A respective adjusting resistor is connected in parallel to the main coil of at least most of the deflectors. A single power supply is connected to the respective main coils of at least most of the deflectors.

A seventh representative embodiment comprises an optical system situated and configured so as to receive a patterned charged particle beam that has passed through a mask defining a pattern region segmented into multiple mask subfields. The optical system projects the patterned charged particle beam onto a surface of a substrate. The optical system comprises a two-stage lens system and multiple deflectors. The two-stage lens system comprises a first lens and a second lens each comprising a respective main coil. Each deflector comprises a respective main coil, wherein the main coils of the first and second lenses are connected to and powered by a first power supply. The main coils of at least most of the deflectors are connected to and powered by a second power supply separate from the first power supply. Each deflector is adjustable so as to allow independent adjustment of at least one of (i) a ratio of electrical current delivered to the respective main coil compared to any of the other deflectors, and (ii) deflection sensitivity of a respective deflector compared to any of the other deflectors.

In general, at least two main coils of the multiple deflectors are driven by a single power supply. This reduces the required number of driving power supplies. It is also preferable for any auxiliary coils to be separately powered by independent power supplies. Because the ampere-turn values of the auxiliary coils are preferably no greater than 1/10 of the ampere-turn values of the corresponding main coils, the power supplies that energize the auxiliary coils require substantially less current stability than required in prior-art systems.

The foregoing and additional features and advantages of the present invention will be more readily apparent from the following detailed description, which proceeds with reference to the accompanying drawing.

BRIEF DESCRIPTION OF THE DRAWING

FIG. 1 is a schematic elevational view of a charged-particle-beam optical system according to a preferred embodiment of the present invention.

DETAILED DESCRIPTION

In general, a charged-particle-beam (CPB) optical system according to the present invention comprises an N number of deflectors used for reducing lens aberrations. At least most of such deflectors have multiple coils comprising at least one main coil having a large ampere-turn and at least one auxiliary coil having a relatively small ampere-turn. At least most of the main coils of the deflectors are driven using the same power supply. An adjusting resistor can be selectively connected as required in parallel to the main coil of a deflector if the deflector requires an adjustment with respect to the field generated by the deflector, relative to other deflectors.

The CPB optical system preferably comprises two types of deflectors. A first type functions to reduce off-axis aberrations of the respective lens and the second type functions to laterally displace the charged particle beam as required to properly expose a particular mask subfield at a particular desired locus on the substrate and/or to correct any lateral displacement of the wafer stage relative to the image-forming position of the mask image.

With respect to deflectors of the first type, each such deflector displaces the charged particle beam laterally. However, the lateral displacements effected by deflectors of the first type cancel each other, yielding a net lateral displacement of zero.

If the amount of lateral deflection imparted by a deflector to a beam is zero, then variations in lateral beam position can nevertheless arise according to the following relationship:

$$\Delta_{beam\ position}\ (C_{power\ supply})(D)=0 \qquad (1)$$

wherein $\Delta_{beam\ position}$ is variation in lateral beam position, denotes proportionality, $C_{power\ supply}$ is the coefficient of variation of the power supply output to the deflector, and D is the amount of lateral deflection.

Desirably, variations in beam deflection should not occur even if the precision of the power supply energizing the deflector coil is less than optimal. If, as in the prior art, each deflector is controlled by an independent power supply, and if one power supply exhibits a relatively large change and another power supply exhibits a relatively small change, then the relationship (1) is no longer applicable and variations in the beam position will occur.

Hence, according to a preferred embodiment of a CPB optical system according to the present invention, each deflector comprises at least one main coil. The main coil of each of at least most of the deflectors is preferably driven using the same power supply. Under such a condition, the relationship (1) holds and substantially no variations arise in beam position as a result of power-supply output fluctuations.

This scheme can also be employed to correct tolerances arising during manufacture of the main coils of the deflectors, wherein electrical current flowing through a main coil can be adjusted as required by connecting a resistor in parallel with the main coil. The resistance of any of such resistors can be selectively changed whenever a change occurs in, for example, the ratio of current flowing through the subject coil relative to one or more other deflectors.

At least one auxiliary coil can be provided in parallel with each of most if not all the deflector main coils. The number of auxiliary coils is preferably sufficient not to adversely affect the accuracy of beam position. By energizing the auxiliary coils using a power supply separate from the power supply used to energize the main coils, aberration correction can be accomplished without changing beam position.

Specific features of the preferred embodiment are now described with reference to FIG. 1. FIG. 1 is particularly directed to an electron-beam (as a representative charged-particle-beam) optical system, but it will be understood that the general principles disclosed in FIG. 1 are generally applicable to any of various other types of CPB optical systems according to the invention.

In FIG. 1, a mask 1, situated in the uppermost portion of the figure, receives electron-beam irradiation from a location further upstream by an illumination-optical system (not shown, but understood to be situated upstream of the mask). Beneath the mask 1 are arranged, in order along an optical axis AX, a first lens 2, a second lens 5, and a substrate (e.g., semiconductor wafer) 7. The electron beam passing through the mask 1 carries an image of the irradiated region of the mask. The image is demagnified and projected onto the substrate 7 by the first and second lenses 2, 5. The first and second lenses 2, 5 collectively function in a manner analogous to a SMD lens.

The mask 1 is "segmented" by which is meant that the mask pattern is subdivided into multiple mask subfields. Generally, each mask subfield is separated from adjacent mask subfields by a "boundary region" (measuring 10 μm wide, for example) that does not define any pattern features. Each mask subfield measures, by way of example, about (11 mm)$^2$ (i.e., 11 mm by 11 mm). Each boundary region typically includes a strut to provide structural rigidity to the mask.

The first lens 2 comprises a main coil 3 situated along the inside diameter of a pole piece 2b, and an auxiliary coil 4 situated along the inside diameter of the main coil 3. The first lens 2 is thus rotationally symmetrical as represented by the open-ended rectangular sectional profile shown in FIG. 1. The pole piece 2b comprises an upper end 2a and a lower end 2c each extending radially inward toward the optical axis AX. The magnetic flux generated by the first lens extends axially between the ends 2a, 2c of the pole piece 2b. Proceeding downward in the FIGURE from the upper end 2a, the magnetic field just inside the upper end 2a increases to and remains at a substantially uniform magnitude down the full length of the pole piece 2b. Proceeding further downward past the lower end 2c, the magnetic field exhibits a decrease in magnitude.

The auxiliary coil 4 of first lens 2 serves, inter alia, to correct any imbalance (i.e., errors in symmetry) of the first lens 2 (and of the second lens 5) that may be caused due to manufacturing errors.

The optical system of FIG. 1 also comprises a first two-stage deflector set 8, 9 situated on the inside diameter of the upper end 2a of the pole piece 2b. The first deflector set 8, 9 functions mainly to remove the boundary regions around the projected mask subfield as the subfield is being projected onto a respective region on the substrate 7. I.e., the first deflector set adjusts the lateral position of the electron beam without changing the propagation direction of the electron beam.

After passing through the first deflector set 8, 9, the electron beam enters the first lens 2 and encounters a second deflector 10 used for reducing aberrations. The second deflector 10 is preferably situated immediately downstream of the upper end 2a of the pole piece 2b. The electron beam then encounters a third deflector 12 and a fourth deflector 14. The third deflector 12 is preferably situated at about midlength of the first lens 2, and the fourth deflector 14 is preferably situated just upstream of the lower end 2c of the pole piece 2b. The deflectors 12 and 14 are typically used for reducing aberrations.

Each of the deflectors 10, 12, 14 comprises a respective main wire coil preferably wound in a saddle-type configuration. The second deflector 10 preferably comprises its main coil 10a and an auxiliary coil 10b. The third deflector 12 preferably comprises its main coil 12a and an auxiliary coil 12b. The fourth deflector 14 preferably comprises its main coil 14a and an auxiliary coil 14b. Each auxiliary coil 10b, 12b, 14b is preferably situated on the outside diameter of the respective main coil 10a, 10b, 10c. Each auxiliary coil 10b, 12b, 14b preferably comprises a number of windings that is, for example, from 1/50 to 1/200 the number of windings of the respective main coils 10a, 12a, 14a.

Adjusting resistors 25, 26 can be connected as required in parallel to, for example, the third deflector 12 and the fourth deflector 14. The resistors 25, 26 function to correct any variations between the deflectors 10, 12, 14 due to manufacturing errors while contributing minimal aberrations to the deflectors 10, 12, 14.

The second lens 5 preferably has a profile that is similar to the profile of the first lens 2, but the profile of the second lens 5 is generally smaller than and inverted relative to the profile of the first lens 2. The polarity of the magnetic field generated by the second lens 5 is preferably opposite to the polarity of the magnetic field generated by the first lens 2. The first lens 5 comprises a main coil 6, but generally lacks an auxiliary coil. In the FIG. 1 embodiment, the main coils 3, 6 of the respective lenses 2, 5 are preferably driven by the same power supply 23. The lack of an auxiliary coil in the second lens 5 allows a relative adjustment to be made between the first lens 2 and the second lens 5. I.e., such an adjustment is more readily made if an auxiliary coil is provided on either of the lenses 2, 5, but not both, by adjusting the electrical current flowing through the auxiliary coil.

As described above, the main coils 3, 6 of the respective lenses 2, 5 are preferably driven by a single power supply 23. Therefore, even if changes arise in the acceleration voltage imparted to the electron beam by the lenses 2, 5, or in the voltage output by the power supply 23, chromatic aberrations of magnification and image rotations do not arise. This benefit substantially eliminates otherwise possible problems of poor beam focusing. Moreover, because the auxiliary coil 4 is provided on the first lens 2 and the auxiliary coil 4 is driven by a separate power supply (not shown in the figure) independently of the main coil 3, problems that would otherwise arise by driving the main coils 3, 6 using the same power supply 23 are avoided. In addition, because the ampere-turn value of the auxiliary coil 4 is preferably 1/10 or less of the ampere-turn value of the main coil 6, any effects of the auxiliary coil 4 on the entire CPB lens system are small. As a result of these benefits, the precision (and thus the cost) of the power supply driving the auxiliary coil 4 can be less (e.g., a precision of $10^{-5}$) than required in conventional systems.

Inside the second lens 5 are preferably situated a first ("upper") deflector set 16, a second ("midlevel") deflector set 18 and a third ("lower") deflector set. The third deflector set preferably comprises three deflectors 20, 21, 22 arranged in tandem. The deflector sets 16, 18 and the deflector 20 are preferably used for reducing aberrations. The deflectors 21, 22 in the third deflector set are preferably used to correct relative displacements of the mask stage (not shown but understood to be used to support the mask 1) and the substrate stage (not shown but understood to be used to support the substrate 7).

The deflectors 21, 22 of the third deflector set constitute a two-stage deflector system for ensuring that the electron beam impinges at zero angle of incidence (vertically in the figure) upon the substrate 7. Although the deflector system for this purpose is preferably two-stage comprising both deflectors 21, 22, the deflector system alternatively can be one-stage (comprising only one of the deflectors 20, 22) because the amount of correction imparted to the electron beam is normally very small.

Among the three deflector sets situated inside the second lens 5, each of the first deflector set 16 and the second deflector set 18 preferably comprises a combination coil including a respective main coil 16a, 18a and a respective auxiliary coil 16b, 18b (similar to the deflectors 10, 12, 14 situated inside the first lens 2). The ratio of ampere-turns and the positional relationships between the main coils and auxiliary coils of the deflector sets 16, 18 are similar to such parameters of the deflectors 10, 12, 14. The main coil of each deflector set 10, 12, 14, 16, 18 is used for aberration reduction; the main coils of these deflector sets, as well as the coil of the deflector 20, are preferably connected together in series and driven by the same power supply 24.

The deflector 20, situated at a lower position inside the second lens 5, differs from the other deflector sets 16, 18 used for aberration reduction in that the deflector 20 preferably lacks an auxiliary coil. Such an auxiliary coil is not required on the deflector 20 because each of the other deflector sets 10, 12, 14, 16, 18 has a respective auxiliary coil that, when adjusted as required, provide satisfactory aberration reduction. (I.e., adjustment of the auxiliary coils 10b, 12b, 14b, 16b, 18b provides sufficient adjustment of all six deflectors 10, 12, 14, 16, 18, 20 relative to each other.) For the same reason, although an adjusting resistor is preferably connected in parallel to the deflectors 16, 18, an adjusting resistor generally is not required on the deflector 20.

The auxiliary coils of the deflectors used for aberration reduction preferably function to vary the ratio of deflection-coil current that provides a minimum-aberration state whenever the particular subfield being irradiated is changed. These auxiliary coils are preferably driven by a respective independent power supply (not shown). The number of turns in each of the deflectors 10, 12, 14, 16, 18, 20 is preferably such that current ratios can be achieved that are sufficient to produce a desired sensitivity of deflection, calculated by simulating a current ratio that eliminates aberrations. As described above, manufacturing errors can be corrected by adjusting the deflection sensitivity of the deflectors utilizing the parallel resistors 25, 26, 27, 28.

As is evident from the description above, many of the deflectors, as used in a CPB optical system according to the invention for aberration reduction, can be energized using a single power supply. Using such an operational scheme, the net deflection imparted to the beam by such deflectors is zero. Consequently, variations in the lateral position of the beam do not occur even if the power supply experiences an instability in power output. By selectively connecting resistors in parallel to the deflectors as required, minimum aberrations can be achieved even when the deflectors have manufacturing errors. By dividing each deflector (used for aberration control) into main coil and an auxiliary coil, and by independently powering each auxiliary coil, desired corrections can be achieved even if beam shifting (even such shifting occurring when aberrations are minimized) occurs at the subfield being projected.

If all or at least most of the main coils of the deflectors are driven by a single power supply (or if at least two main coils are driven by a single power supply), the number of power supplies can be reduced, thereby lowering cost without compromising performance.

By controlling the two-stage projection lens using a single power supply, any problems with poor beam focusing are substantially eliminated even if changes arise in beam-acceleration voltage or in the power output from the power supply. By providing an auxiliary coil to correct any manufacturing errors in the two lenses and by energizing the auxiliary coil using a separate power supply from the power supply for the main coils, otherwise possible problems related to driving the main coils of the lenses using a single power supply are avoided.

Whereas the invention has been described in connection with a preferred embodiment, it will be understood that the invention is not limited to that embodiment. On the contrary, the invention is intended to encompass all alternatives, modifications, and equivalents as may be included within the spirit and scope of the invention as defined by the appended claims.

What is claimed is:

1. A charged-particle-beam optical system, comprising:
   (a) a projection-lens system that receives a charged particle beam that has passed through an illuminated region of a pattern defined by a mask so as to form an image of the illuminated region, the projection-lens system comprising a two-stage lens system and being operable to project the image onto a surface of a substrate;
   (b) multiple charged-particle-beam deflectors associated with the two-stage lens system, each deflector comprising a main coil, wherein at least one of the deflectors additionally comprises an auxiliary coil, the main and auxiliary coils of the deflector having a relatively large and a relatively small ampere-turn value, respectively; and
   (c) at least two of the main coils of the multiple deflectors being driven by a single power supply.

2. A charged-particle-beam optical system, comprising:
   (a) a projection-lens system that receives a charged particle beam that has passed through an illuminated region of a pattern defined by a mask so as to form an image of the illuminated region, the projection-lens system comprising a two-stage lens system and being operable to project the image onto a surface of a substrate;
   (b) multiple charged-particle-beam deflectors associated with the two-stage lens system, each deflector comprising a main coil; and
   (c) an adjusting resistor, wherein the coils of at least two of the deflectors are connected in series to a single power source and the adjusting resistor is connected in parallel to at least one of the coils.

3. A charged-particle-beam optical system, comprising:
   (a) a projection-lens system that receives a charged particle beam that has passed through an illuminated region of a pattern defined by a mask so as to form an image of the illuminated region, the projection-lens system comprising a two-stage lens system and being operable to project the image onto a surface of a substrate;

(b) the two-stage lens system comprising a first lens and a second lens each comprising a respective main coil, at least one of the first and second lenses additionally comprising an auxiliary coil wherein the main and auxiliary coils of said lens have relatively large ampere-turn and small ampere-turn values, respectively; and (c) a single power supply connected to and operable to energize the main coils of the first and second lenses.

4. A charged-particle-beam optical system, comprising:

(a) a projection-lens system that receives a charged particle beam that has passed through an illuminated region of a pattern defined by a mask so as to form an image of the illuminated region, the projection-lens system comprising a two-stage lens system and being operable to project the image onto a surface of a substrate, the two-stage lens system comprising a first lens and a second lens each comprising a main coil;

(b) an adjusting resistor connected in parallel to the main coil of at least one of the first and second lenses; and (c) a single power supply connected to and operable to energize the main coils of the first and second lenses.

5. A charged-particle-beam optical system, comprising:

(a) a projection-lens system that receives a charged particle beam that has passed through an illuminated region of a pattern defined by a mask so as to form an image of the illuminated region, the projection-lens system comprising a two-stage lens system and being operable to project the image onto a surface of a substrate;

(b) multiple deflectors situated and configured to reduce, when energized, aberrations of the charged-particle-beam optical system;

(c) at least most of the deflectors each comprising a respective main coil and a respective auxiliary coil, the respective main coils and corresponding auxiliary coils having a relatively large ampere-turn value and a relatively small ampere-turn value, respectively; and (d) a single power supply connected to and operable to power at least most of the main coils of the deflectors.

6. A charged-particle-beam optical system, comprising:

(a) a projection-lens system that receives a charged particle beam that has passed through an illuminated region of a pattern defined by a mask so as to form an image of the illuminated region, the projection-lens system comprising a two-stage lens system and being operable to project the image onto a surface of a substrate;

(b) multiple deflectors situated and configured to reduce, when energized, aberrations of the charged-particle-beam optical system, each deflector comprising a respective main coil;

(c) a respective adjusting resistor connected in parallel to the main coil of at least most of the deflectors; and (d) a single power supply connected to the respective main coils of and operable to energize at least most of the deflectors.

7. A charged-particle-beam optical system, comprising:

(a) an optical system situated and configured so as to receive a patterned charged particle beam that has passed through a mask defining a pattern region segmented into multiple mask subfields, the optical system projecting the patterned charged particle beam onto a surface of a substrate, the optical system comprising a two-stage lens system and multiple deflectors;

(b) the two-stage lens system comprising a first lens and a second lens each comprising a respective main coil, and each deflector comprising a respective main coil, wherein the main coils of the first and second lenses are connected to and powered by a first power supply, and the main coils of at least most of the deflectors are connected to and powered by a second power supply; and (c) each deflector being adjustable so as to allow independent adjustment of at least one of (i) a ratio of electrical current delivered to the respective main coil compared to any of the other deflectors, and (ii) deflection sensitivity of a respective deflector compared to any of the other deflectors.

* * * * *

UNITED STATES PATENT AND TRADEMARK OFFICE
CERTIFICATE OF CORRECTION

PATENT NO.  : 6,078,054
DATED       : June 20, 2000
INVENTOR(S) : Mamoru Nakasuji It is certified that error appears in the above-identified patent and that said Letters Patent is hereby corrected as shown below:

The equation in column 4, line 43, should read --$\Delta_{\text{beam position}} \propto (C_{\text{power supply}})(D) = 0$--.

In column 4, lines 44-45, "position, denotes" should read --position, $\propto$ denotes--.

Signed and Sealed this

Twenty-second Day of May, 2001

Attest:

NICHOLAS P. GODICI

Attesting Officer    Acting Director of the United States Patent and Trademark Office